US010838311B2

(12) United States Patent
Nakano et al.

(10) Patent No.: US 10,838,311 B2
(45) Date of Patent: Nov. 17, 2020

(54) COATING AND DEVELOPING APPARATUS AND COATING AND DEVELOPING METHOD

(71) Applicant: Tokyo Electron Limited, Tokyo (JP)

(72) Inventors: Keigo Nakano, Kumamoto (JP); Koji Takayanagi, Kumamoto (JP); Masashi Tsuchiyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/594,204

(22) Filed: Oct. 7, 2019

(65) Prior Publication Data

US 2020/0110343 A1 Apr. 9, 2020

(30) Foreign Application Priority Data

Oct. 9, 2018 (JP) .................................. 2018-191170

(51) Int. Cl.
| | |
|---|---|
| *G03F 7/20* | (2006.01) |
| *G03F 7/16* | (2006.01) |
| *G03F 7/30* | (2006.01) |
| *G03F 7/38* | (2006.01) |

(52) U.S. Cl.
CPC .......... *G03F 7/70875* (2013.01); *G03F 7/162* (2013.01); *G03F 7/168* (2013.01); *G03F 7/20* (2013.01); *G03F 7/30* (2013.01); *G03F 7/38* (2013.01)

(58) Field of Classification Search
CPC ....... G03F 7/70875; G03F 7/162; G03F 7/168
USPC .......................................................... 355/75
See application file for complete search history.

(56) References Cited

U.S. PATENT DOCUMENTS

| | | | |
|---|---|---|---|
| 2008/0032500 A1* | 2/2008 | Asou ................ | H01L 21/67063 438/653 |
| 2009/0033908 A1* | 2/2009 | Matsumoto ............ | G01B 7/003 355/75 |

FOREIGN PATENT DOCUMENTS

JP 2000-164670 A 6/2000

* cited by examiner

*Primary Examiner* — Hung Nguyen
(74) *Attorney, Agent, or Firm* — Abelman, Frayne & Schwab

(57) ABSTRACT

A coating and developing apparatus includes: a processing block having a plurality of substrate transport areas vertically stacked and partitioned from each other; a processing module provided in each of the plurality of substrate transport areas; a transport mechanism configured to transport a substrate between the transport block and the processing module; a temperature adjustment module configured to adjust a temperature of the substrate before the substrate is transported to at least one processing module among the plurality of the processing modules; a temperature sensor configured to detect an atmospheric temperature of at least one substrate transport area; and a temperature controller configured to change the temperature of the substrate in the temperature adjustment module based on the atmospheric temperature detected by the temperature sensor.

13 Claims, 14 Drawing Sheets

COATING AND DEVELOPING APPARATUS AND COATING AND DEVELOPING METHOD

CROSS-REFERENCE TO RELATED APPLICATIONS

This application is based on and claims priority from Japanese Patent Application No. 2018-191170, filed on Oct. 9, 2018 with the Japan Patent Office, the disclosure of which is incorporated herein in its entirety by reference.

TECHNICAL FIELD

The present disclosure relates to a coating and developing apparatus and a coating and developing method.

BACKGROUND

In a semiconductor device manufacturing process, various processings are performed on a semiconductor wafer (hereinafter, referred to as a "wafer") which is a substrate. Examples of the processings include resist pattern formation through resist coating and developing in a photolithography process. For example, Japanese Patent Laid-Open Publication No. 2000-164670 discloses a substrate processing apparatus that performs resist coating and developing. The substrate processing apparatus includes a substrate transport mechanism that loads/unloads a substrate into/out of each processing unit and an air adjustment unit that forms a downflow in a transport area of the substrate transport mechanism by supplying air adjusted with temperature and humidity, to the transport area.

SUMMARY

A coating and developing apparatus including, as processing modules each configured to perform a processing on a substrate, a resist film forming module configured to form a resist film on the substrate and a developing module configured to develop the resist film on which exposure has been completed, the coating and developing apparatus comprising: a processing block having a plurality of substrate transport areas vertically stacked and partitioned from each other; a transport block configured to transport the substrate between a transport container that stores the substrate and each of the substrate transport areas; the processing module provided in each of the plurality of substrate transport areas; a transport mechanism provided in each of the plurality of substrate transport areas and configured to transport the substrate between the transport block and the processing module; a temperature adjustment module configured to adjust a temperature of the substrate before the substrate is transported to at least one processing module among the plurality of the processing modules in order to adjust the temperature of the substrate in the at least one processing module, the substrate, of which the temperature has been adjusted temperature, being unloaded from the temperature adjustment module by the transport mechanism; a temperature sensor configured to detect an atmospheric temperature of at least one substrate transport area among the plurality of substrate transport areas; and a temperature changing mechanism configured to change the temperature of the substrate in the temperature adjustment module based on the atmospheric temperature detected by the temperature sensor.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Figure 1:
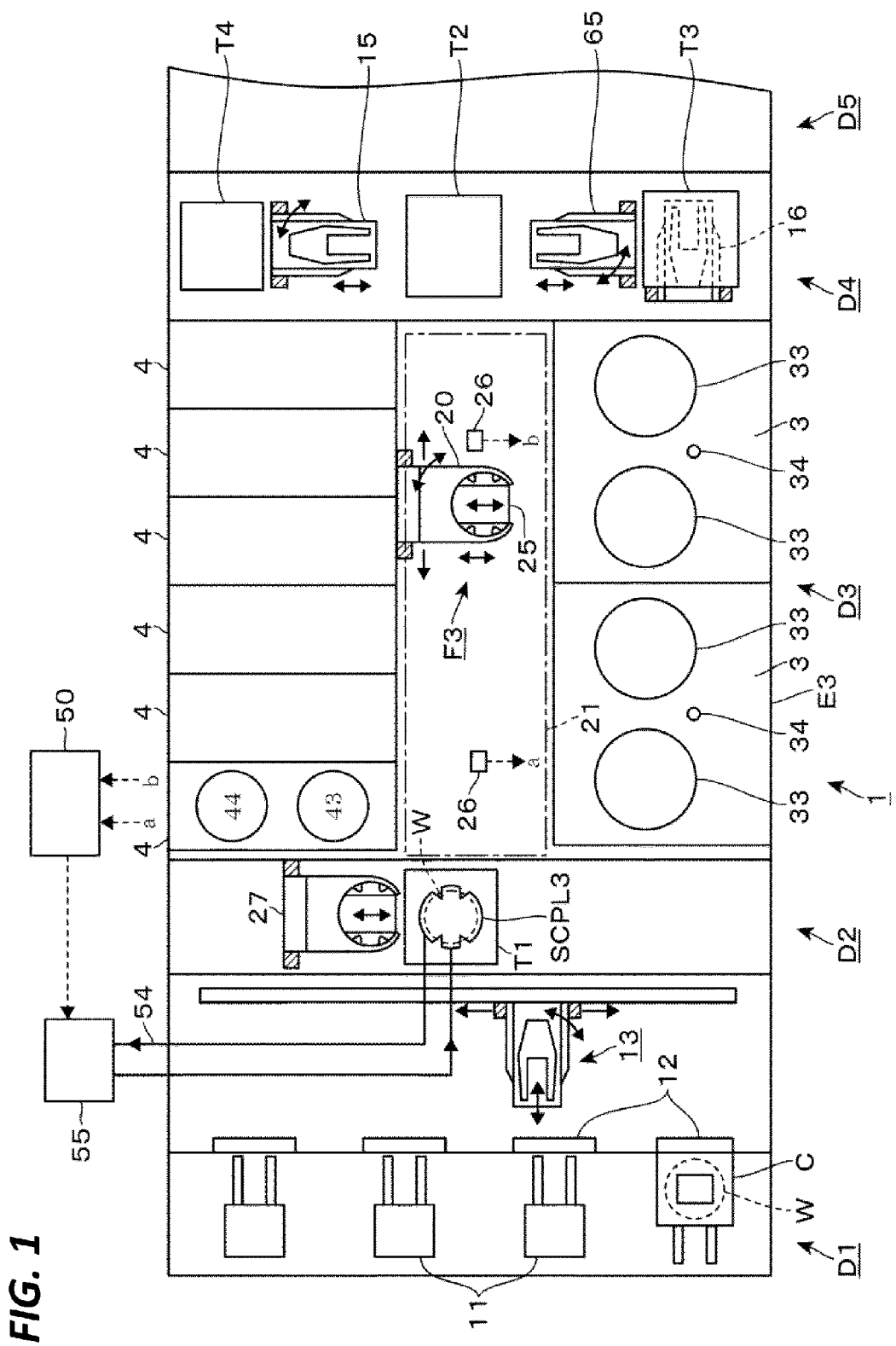
FIG. 1 is a plan view of a coating and developing apparatus according to an embodiment of the present disclosure.
Figure 2:
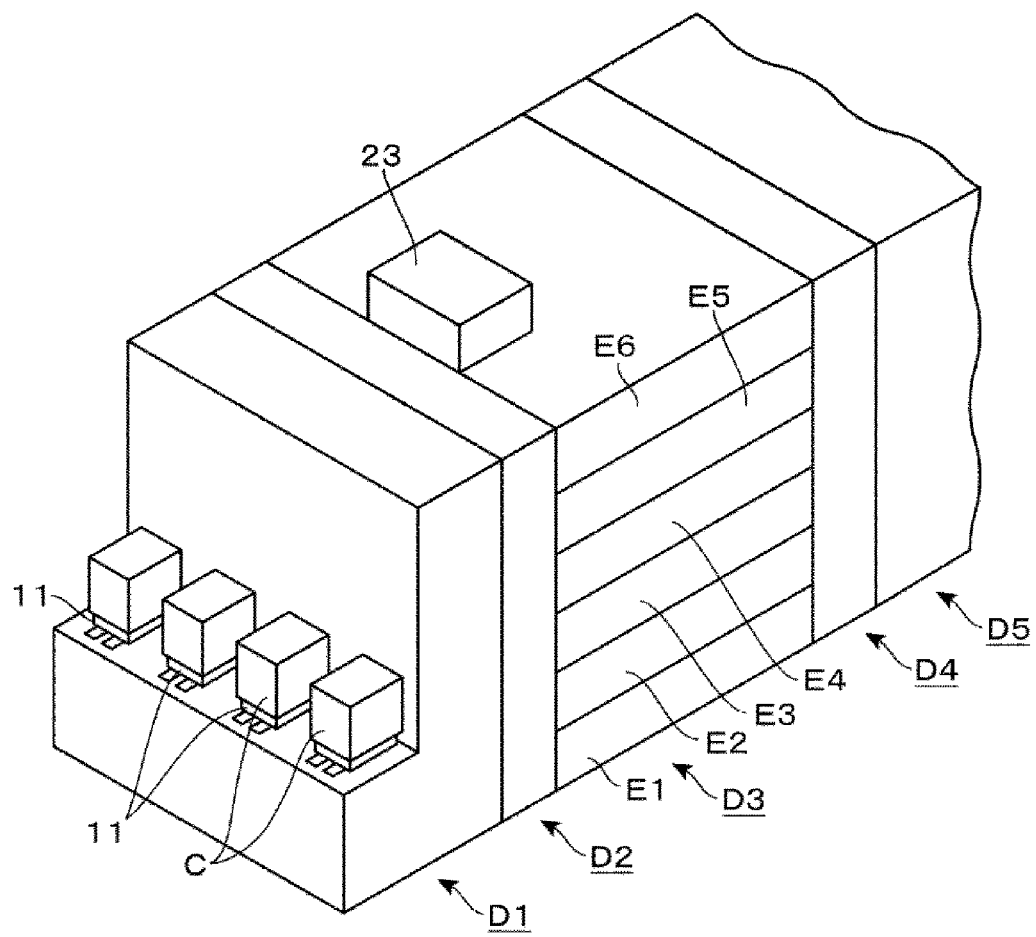
FIG. 2 is a perspective view of the coating and developing apparatus.
Figure 3:
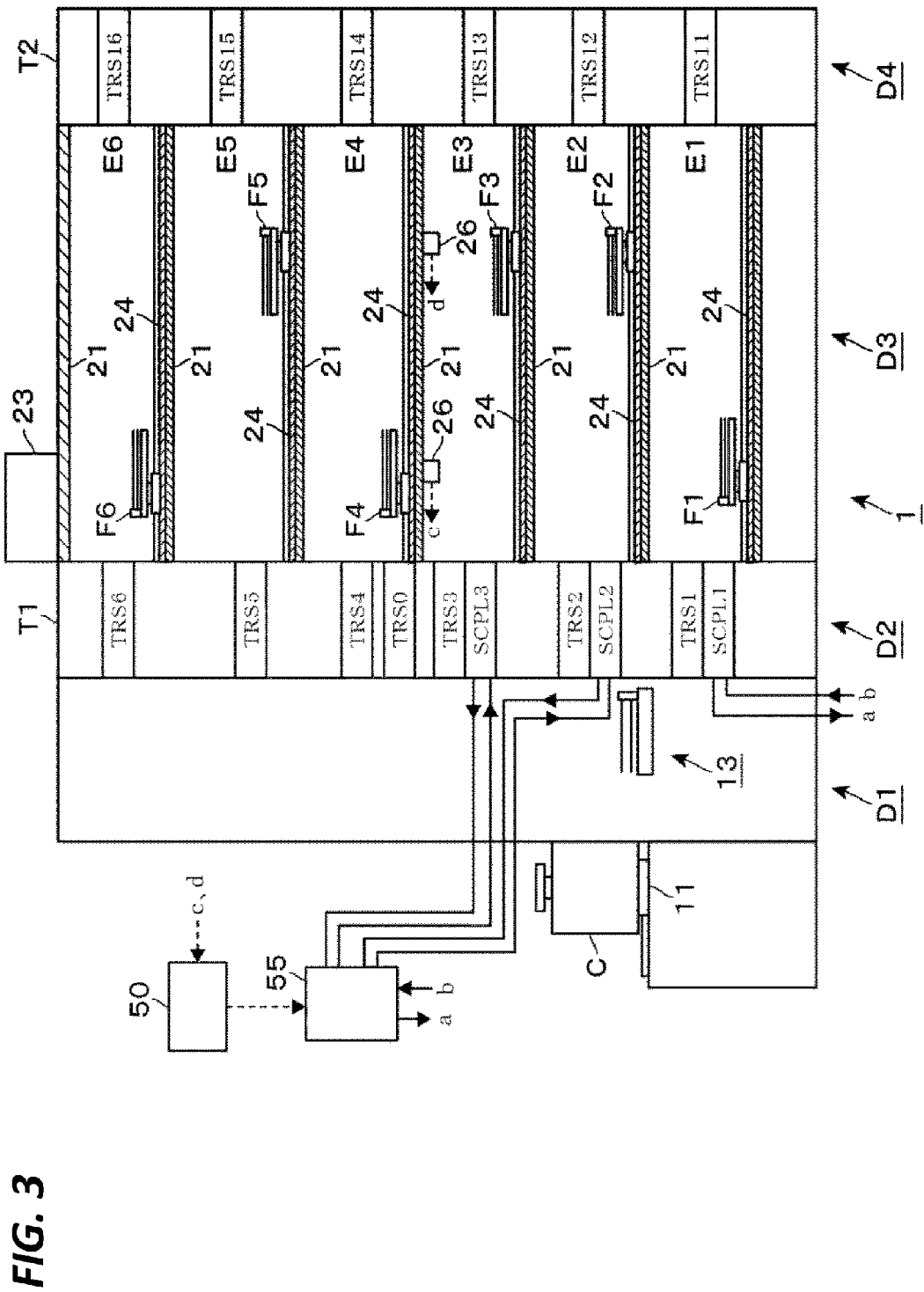
FIG. 3 is a vertical cross-sectional side view of the coating and developing apparatus.

A coating and developing apparatus 1 which is an embodiment of the present disclosure and is one of substrate processing apparatuses will be described with reference to FIGS. 1 to 3. FIG. 1, FIG. 2, and FIG. 3 are a plan view, a schematic perspective view, and a vertical cross-sectional side view of a coating and developing apparatus 1, respectively. The coating and developing apparatus 1 is installed in a clean room having an air atmosphere, and is configured by linearly connecting a carrier block D1, a vertical transport block D2, a processing block D3, and an interface block D4 in this order. It is assumed that the carrier block D1 side is the front side and the interface block D4 side is the rear side. In the following description, unless otherwise specified, the left side and the right side are the left side and the right side when viewed from the front to the rear. An exposure machine D5 is connected to the rear side of the interface block D4. The carrier block D1 and the vertical transport block D2 are front blocks, and the interface block D4 is a rear block. The carrier block D1, the vertical transport block D2, and the interface block D4 are provided as a transport block provided in common to each unit block to be described later. The transport block is configured to deliver a wafer W between a carrier C and each unit block.

A carrier C configured to store a wafer W is transported to the carrier block D1 from the outside of the coating and developing apparatus 1, and the carrier block D1 includes a stage 11 of the carrier C, an opening/closing unit 12, and a transport mechanism 13 configured to transport the wafer W from the carrier C through the opening/closing unit 12.

Before describing the vertical transport block D2, the processing block D3 will be described. As illustrated in FIGS. 2 and 3, the processing block D3 includes unit blocks E1 to E6 that perform a liquid processing and a heating processing on a wafer W in order from the bottom, and the unit blocks E1 to E6 are partitioned from each other. The unit blocks E1 to E3 are configured similar to each other, and forms a resist film through a resist coating processing as a liquid processing. The unit blocks E4 to E6 are configured similar to each other, and form a resist pattern through a developing processing as a liquid processing. In each unit block E (E1 to E6), the transport of a wafer W and the processing of a wafer W are performed in parallel.

Figure 4:
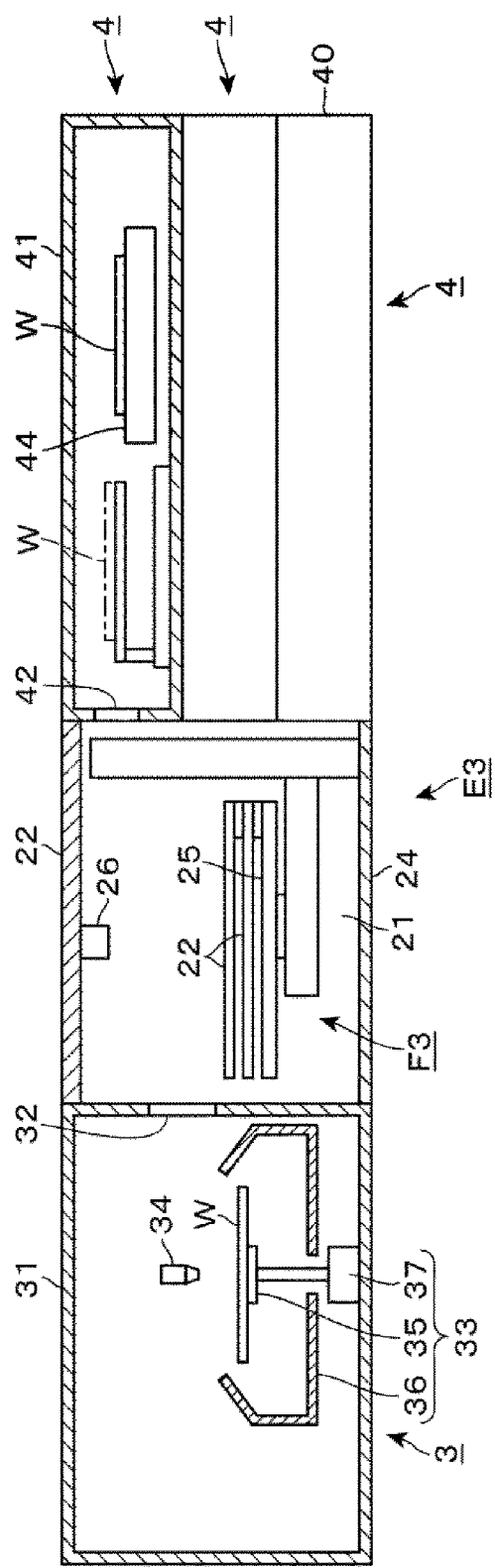
FIG. 4 is a vertical cross-sectional front view of a unit block constituting the coating and developing apparatus.

On behalf of the unit blocks E1 to E6, the unit block E3 will be described with reference to FIG. 4 which is a longitudinal cross-sectional front view. The unit block E3 is a flat rectangular body having a space for forming a substrate transport area therein, and a wafer W transport path 21 linearly extending in the front-rear direction is formed as the substrate transport area in the left and right central portions. In the figure, reference numeral 22 denotes the ceiling portion of the transport path 21, which is formed hollow and has a lower surface constituted by a ULPA filter. The ceiling portion 22 is connected to a fan filter unit (FFU) 23 provided on the upper portion of the processing block D3 via a duct (not illustrated) (see, for example, FIGS. 2 and 3). The FFU 23 takes in the air in the clean room where the coating and developing apparatus 1 is installed and supplies the air to the ceiling portion 22. The air is ejected from the lower surface of the ceiling portion 22 to form a downflow, and is supplied to each processing module that faces the transport path 21. In the figure, reference numeral 24 denotes a bottom wall that forms the bottom portion of the transport path 21.

A resist film forming module 3 is provided on the right side of the unit block E3, and an exhaust unit 40 for exhausting the atmospheres of the heating module 4 and the conveyance path 21 is provided on the left side of the unit block E3. The resist film forming module 3 and the heating module 4 are processing modules for processing a wafer W. Two resist film forming modules 3 are provided, for example, in the front and rear. Two heating modules 4 are stacked vertically to form a stacked body, and six stacks of heating modules 4 are arranged in the front and rear. An elongated exhaust unit 40 is provided in the front and rear below the stacked bodies arranged in the front and rear.

The resist film forming modules 3, the heating modules 4, and the exhaust unit 40 define left and right parts of the transport path 21. Accordingly, the resist film forming modules 3 and the heating modules 4 are provided so as to face the transport path 21 in the left-right direction. In addition, the atmosphere of the unit block F3 is partitioned from the atmospheres of other unit blocks by arranging respective processing modules, the exhaust unit 40, the ceiling portion 22, and the bottom wall 24 as described above. More specifically, the atmosphere of the unit block F3 is the atmosphere in the transport path 21 of the unit block F3 and in each processing module provided in the unit block F3.

The resist film forming module 3 that is a liquid processing module will be briefly described. In the figure, reference numeral 31 denotes a housing, which includes a transport port 32 that opens to the transport path 21. In the housing 31, two processing units 33, each of which processes a wafer W, and a nozzle 34 which is shared by each processing unit 33, are provided. The processing unit 33 includes a spin chuck 35 that holds the central portion of the wafer W by suction, a cup 36 that surrounds the side periphery of the wafer W held by the spin chuck 35, and a rotation mechanism 37 that rotates the spin chuck 35. The wafer W is delivered between the transport mechanism F3 (to be described later) and the spin chuck 35 by lifting pins (not illustrated) provided in the cup 36. The nozzle 34 described above is configured to be movable so as to eject a resist as a chemical liquid to the central portion of the wafer W rotated in each processing unit 33, and a resist film is formed through spin coating in each processing unit 33.

A heating module 4 will be briefly described. In the figure, reference numeral 41 denotes a housing, which includes a transport port 42 that opens to the transport path 21. In the housing 41, a cooling plate 43, which includes a flow path in which a coolant is supplied and cools a wafer W placed thereon by the action of the coolant, and a heat plate 44 are provided. The wafer W is delivered to the cooling plate 43 by the raising/lowering operation of the transport mechanism F3. In the figure, reference numeral 45 denotes a mechanism for moving the cooling plate 43 between the front side (transport port 42 side) in the housing 41 and the area above the hot plate 44 disposed in the deeper side in the housing 41. The hot plate 44 includes lifting pins (not illustrated) for delivering a wafer W between the hot plate 44 and the cooling plate 43 moved to the upper area, and heats the wafer W placed thereon. Accordingly, in the heating module 4, the wafer W is delivered in the order of the cooling plate 43, the hot plate 44, and the cooling plate 43, so that the temperature of the wafer W is adjusted before and after heat treatment. The heating module 4 provided in the unit block E3 is a module for performing pre-applied bake (PAB) on a resist film.

A transport mechanism F3 is provided in the transport path 21 of the unit block E3. The transport mechanism F3 includes a base that is capable of moving the transport path 21 back and forth, raising/lowering the transport path 21, and rotating the transport path 21 around a vertical axis, and two substrate supports 20 which are independently movable back and forth on the base 25 and each of which is capable of supporting a wafer W. Wafers W are sequentially transported between the modules provided in the unit block F3 and the modules provided in the unit blocks F3 in towers T1 and T2 (to be described later) using the two substrate supports 20. Specifically, for one module, a wafer W is received by one substrate support 20 that does not hold a wafer W. Then, a wafer W held by another substrate support 20 is transported to the one module that has received a wafer W to be capable of transporting the wafer W. That is, the transport is performed such that wafers W are replaced in each module. The base 25 moves between respective modules, more precisely between delivery positions for delivering a wafer W in front of respective modules such that the substrate supports 20 are capable of performing such replacement.

In addition, a temperature sensor 26 for detecting the temperature of the transport path 21 is provided at a position immediately below the ceiling portion 22 in the transport path 21, at which the temperature sensor 26 does not interfere with transport of the wafer W. For example, two temperature sensors 26 are provided at an interval in the front and rear of the transport path 21. The temperature sensors 26 transmit a detection signal corresponding to the detected temperature to a controller 50 (to be described later).

Hereinafter, unit blocks other than E3 will be described. The unit blocks E1 and E2 are not provided with the temperature sensors 26 in this example. Except for such a difference, the unit blocks E1 and E2 are configured similar to the unit block E3. That is, each of the unit blocks E1 to E3 includes a resist film forming module 3 as one processing module, and forms a resist film as the same type of processing. One of the unit blocks E1 to E3 corresponds to a first substrate transport areas, and the other corresponds to a second substrate transport area.

For the unit blocks E4 to E6 will be mainly described with reference to the difference between the unit blocks E4 to E6 and the unit block E3. For example, a developing module is provided instead of the resist film forming module 3, as a liquid processing module. This developing module has the same configuration as that of the resist film forming module 3 except that a developing liquid is supplied as a chemical liquid from the nozzle 34 instead of the resist. The heating modules 4 of the unit blocks E4 to E6 are modules for performing heating post-exposure bake (PEB) on a wafer W after exposure and before development. For the unit blocks E4 to E6, no temperature sensor 26 is provided in this example.

Thus, each of the unit blocks E1, E2, E4, E5, and E6 has substantially the same configuration as that of the unit block E3, and thus, the atmospheres of respective unit blocks E are partitioned from each other. The transport mechanisms corresponding to the transport mechanisms F3 provided in the unit blocks E1, E2, E4, E5, and E6 are denoted by F1, F2, F4, F5, and F6, respectively (see, for example, FIG. 3).

Next, the vertical transport block D2 will be described. The vertical transport block D2 includes a tower T1 that extends vertically across the unit blocks E1 to E6. The tower T1 is located in front of the transport path 21 of each of the unit blocks E (E1 to E6), and is configured by stacking a large number of modules. In addition, on the left side of the tower T1, a transport mechanism 27 configured to be movable up and down is provided such that a wafer W is capable of being delivered between respective modules provided in the tower T1 (see, for example, FIG. 1).

The modules provided in the tower T1 include delivery modules TRS and temperature adjustment modules SCPL. The delivery modules TRS are provided at respective heights corresponding to the unit blocks E1 to E6. That is, the transport modules TRS are provided at heights at which the transport mechanisms F1 to F6 provided in the unit blocks E1 to E6 are capable of delivering wafers W, respectively, and the modules located at the heights corresponding to the unit blocks E1 to E6 as described above are denoted as TRS1 to TRS6 (see, for example, FIG. 3). In addition, as a delivery module TRS provided in the tower T1, there is one provided for the delivery to the carrier block D1 at a height accessible by the transport mechanism 13 of the carrier block D1. The delivery module is denoted by TRS0.

The temperature adjusts module SCPL are provided at the heights corresponding to respective unit blocks E1 to E3, that is, the heights at which the transport mechanisms F1 to F3 are capable of transporting wafers W, respectively. The delivery modules having the heights corresponding to the respective modules E1 to E3 are denoted as SCPL1 to SCPL3 (see, for example, FIG. 3). Wafers W are delivered between the delivery module, the temperature adjustment module, and the unit block having heights corresponding to each other.

Figure 5:
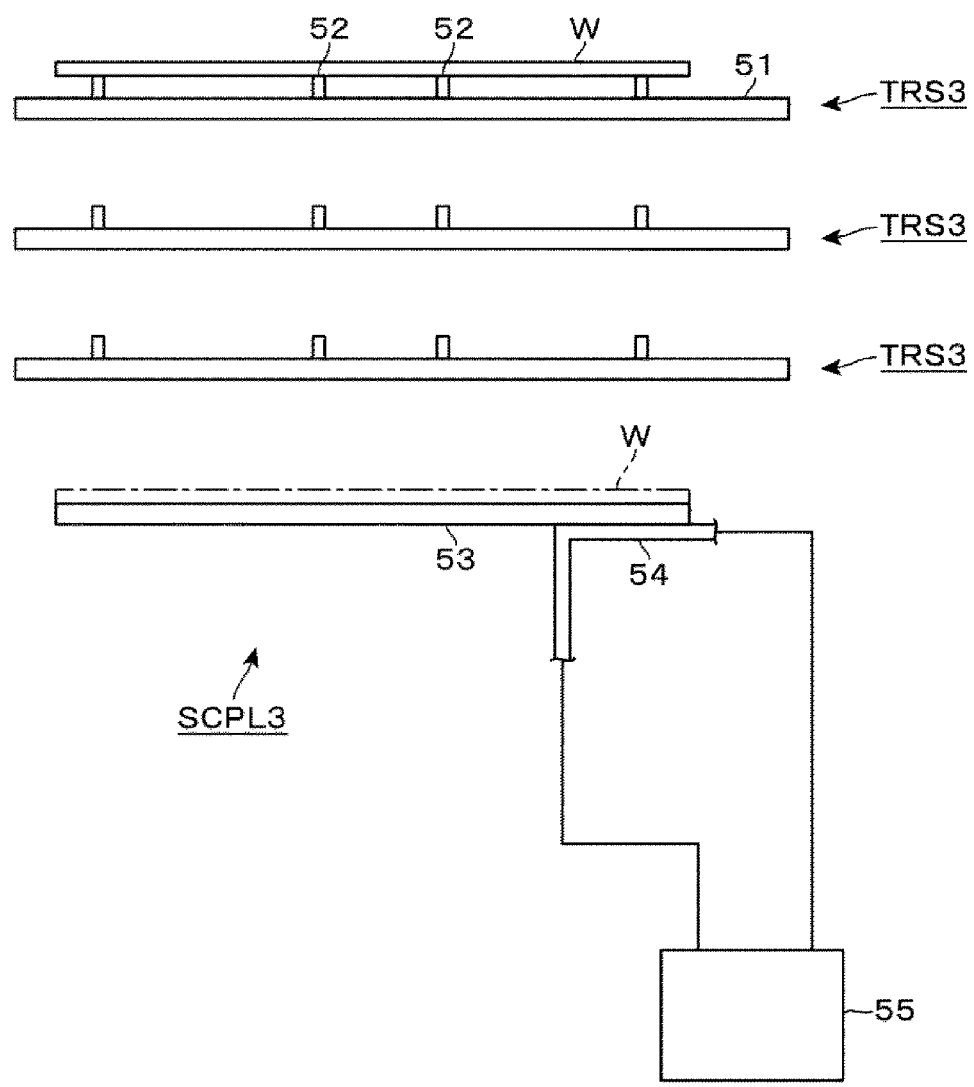
FIG. 5 is a side view of a delivery module and a temperature adjustment module constituting the coating and developing apparatus.

FIG. 5 illustrates delivery modules TRS3 and a temperature adjustment module SCPL3 corresponding to the unit block E3. Although only one delivery module TRS3 is illustrated in FIG. 3, a plurality of delivery modules TRS3 are provided vertically as illustrated in FIG. 5. In the case other delivery modules such as, for example, TRS1, a plurality of delivery modules are also provided in the same manner as the delivery modules TRS3. Each delivery module TRS3 includes a plurality of vertical pins 52 distributed and arranged in the horizontal direction on the horizontal plate 51, and a wafer W is placed on the pins 52.

The temperature adjustment module SCPL3 includes a plate 53 on which a wafer W is placed, and the plate 53 has a shape in which the wafer W is transported by the raising/lowering operation of the transport mechanism F3. A pipe 54, through which a coolant such as, for example, water flows, is connected to the plate 53. One end and the other end of the pipe 54 are drawn to the outside of, for example, the vertical transport block D2 and connected to the chiller 55, and the chiller 55 and the pipe 54 form a coolant circulation path. The chiller 55 includes a pump that sends the coolant to the one end of the pipe 54 such that the coolant circulates in the circulation path, and is configured to be able to adjust the temperature of the coolant that is sent in that way. The temperature of the sent coolant is capable of being changed to a desired temperature, and the temperatures of the plate 53 and the wafer W placed on the plate 53 are adjusted to the temperature of the coolant send from the chiller 55 as described above. In this example, the chiller 55 is common to the temperature adjustment modules SCPL1 to SCPL3. Accordingly, the temperatures of the wafers W are adjusted to the same temperature by the temperature adjustment modules SCPL1 to SCPL3.

Next, the interface block D4 will be described. The interface block D4 includes towers T2 to T4 that extend vertically across the unit blocks E1 to E6. The tower T2 is located behind the transport path 21 of each of the unit blocks E (E1 to E6), and is configured by stacking a large number of modules. As the modules constituting the tower T2, delivery modules TRS are included at the heights corresponding to the unit blocks E1 to E6, similar to the tower T1, and are denoted as TRS11 to TRS16. The delivery modules TRS11 to TRS16 are configured in the same manner as the delivery modules TRS1 to TRS6, so that, for each of the delivery modules TRS1 to TRS16, a plurality of delivery modules are provided. However, in FIG. 3, for each or the delivery modules TRS11 to TRS16, only one delivery module is illustrated in the same manner as the transport modules TRS1 to TRS6.

The towers T3 and T4 are provided on the right side and the left side of the tower T2, respectively. The towers T3 and T4 include, for example, a cleaning module for cleaning a wafer W after exposure and a buffer module for making a wafer W stand by, which are not illustrated. The interface block D4 is provided with transport mechanisms 14 to 16 that transport wafers W to the towers T2 to T4, respectively. The transport mechanism 14 is a transport mechanism that is movable up and down to transport wafers W to the tower T2 and the tower T3, and the transport mechanism 15 is a transport mechanism that is movable up and down to transport wafers W to the tower T2 and the tower T4. The transport mechanism 16 is a mechanism for delivering a wafer W between the tower T2 and the exposure machine D5.

Next, the controller 50 illustrated in FIG. 1 will be described. The controller 50 is a computer, and a program stored in a storage medium such as, for example, a compact disk, a hard disk, a memory card, or a DVD is installed to the controller 50. Instructions (respective steps) are incorporated in the program such that a control signal is output to each unit of the coating and developing apparatus 1 by the installed program. By this control signal, the transport of a wafer W by each transport mechanism, the processing of a wafer W by each processing module, and the temperature adjustment of a wafer W by the temperature adjustment modules SCPL1 to SCPL3 are controlled. The controller 50 is provided with a storage unit that stores data necessary for temperature control by the temperature adjustment modules SCPL1 to SCPL3 (to be described later).

Figure 6:
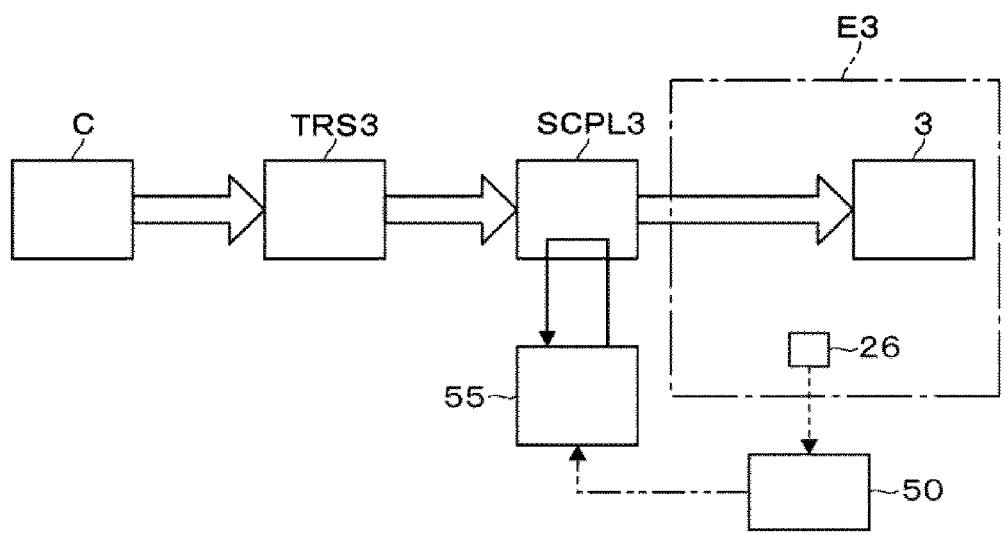
FIG. 6 is an explanatory view illustrating a wafer transport path.

FIG. 6 is an explanatory view illustrating the outline of the operation of the coating and developing apparatus 1 and shows a transport path of a wafer W transported to the unit block E3 by the white arrows. The wafer W unloaded from a carrier C is transported to the delivery module TRS3, and then transported to the temperature adjustment module SCPL3 by the transport mechanism F3 to adjust the temperature. Thereafter, the wafer W is directly transported to the resist film forming module 3 by the transport mechanism F3 via the transport path 21 of the unit block E3. That is, the wafer W is transported to the resist film forming module 3 without being placed on other modules. The module described here is a place where a wafer W is placed in addition to the transport mechanism.

In the resist film forming module 3, as described above, a resist film is formed through spin coating. However, the fluidity of the resist varies depending on the temperature of the wafer W, and thus the film thickness of the formed resist film also varies. That is, the temperature adjustment performed by the temperature adjustment module SCPL3 is performed to form a resist film having a desired film thickness. Although the unit block E3 has been described as a representative, the wafers W of which the temperatures have been adjusted by the temperature adjustment modules SCPL1 and SCPL2 are also directly transported to the resist film forming module 3 in the unit blocks E1 and E2 as in the unit block E3.

Figure 7:
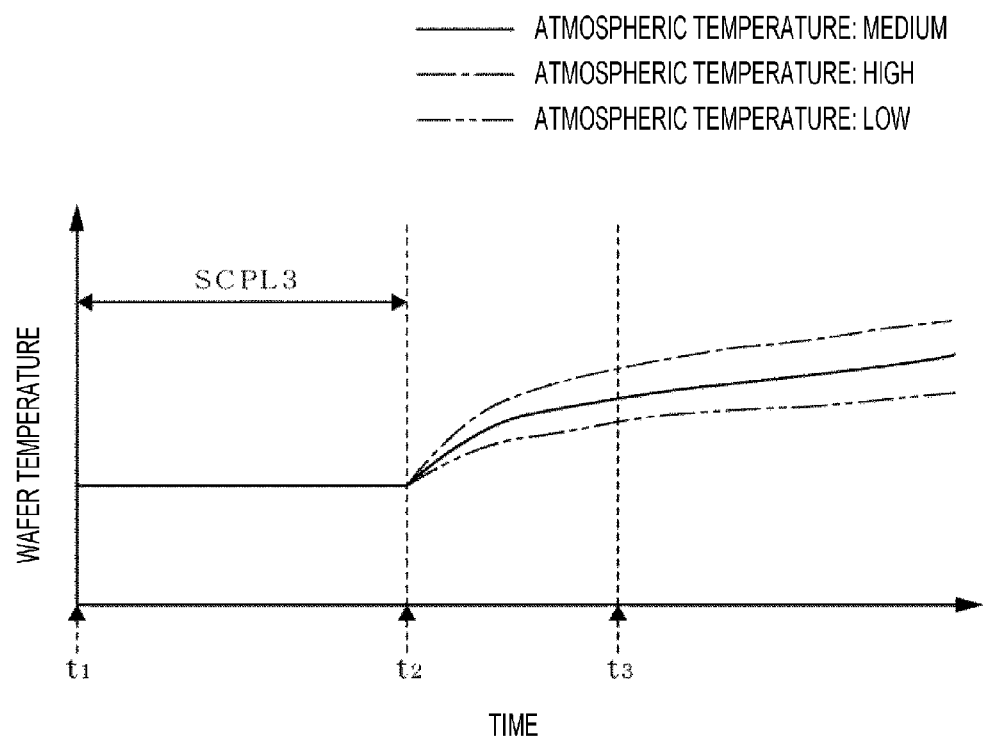
FIG. 7 is a graph representing time-dependent changes in the temperatures of wafers transported in the unit block.

However, the temperature of the clean room in which the coating and developing apparatus 1 is installed may fluctuate due to factors such as, for example, fluctuation in factory power. Since the air of the clean room is supplied to each unit block E as described above, the atmospheric temperatures in the unit blocks E1 to E3 may fluctuate due to the fluctuation in the temperature of the clean room. The graph of FIG. 7 represents an outline of the temperature transition of each of a plurality of wafers W transported from the temperature adjustment module SCPL3 to the resist film forming module 3 when the temperature of the clean room fluctuates as described above. In addition, FIG. 7 is a graph on the assumption that temperature adjustment of the temperature adjustment module SCPL3 based on a temperature detected by a temperature sensor 26 (to be described later) is not performed. Time is set on the horizontal axis and the temperature of a wafer W is set on the vertical axis. As described above, the temperature of the unit block E3 varies, but in the graph of FIG. 7, the solid line indicates the temperature transition of a wafer W when the atmospheric temperature of the unit block E3 is the set temperature. The one-dot chain line represents the temperature transition of a wafer W when the atmospheric temperature is higher than the set temperature, and the two-dot chain line represents the temperature transition of a wafer W when the atmospheric temperature is lower than the set temperature.

The wafers W are placed on the temperature adjustment module SCPL3 from time t1 to time t2 in the graph, and are transported on the transport path 21 from time t2 to time t3. At time t3, the wafers W are loaded into the resist film forming module 3. After time t3, the wafers W are subjected to a processing in the resist film forming module 3. Until the time t2, since the temperature of each wafer W is adjusted to the temperature of the temperature adjustment module, the temperatures of the wafers W are equal to each other as represented in the graph regardless of the atmospheric temperature of the unit block E3. However, after time t2, that is, during the transport of wafers W, the temperature of each wafer W is affected by the atmospheric temperature of the unit block E3, and the temperature difference between the wafers W increases as time elapses. As a result, the temperature at time t3 when loaded into the resist film forming module 3 varies for each wafer W, and the processing is performed on each wafer W without eliminating the variation in temperature. Accordingly, the film thickness of the resist film may vary between the wafers W.

The cause of the temperature fluctuation of the unit blocks E1 to E3 is not limited to the temperature fluctuation of the clean room described above. For example, the temperature fluctuation of the hot plate 44 constituting the heating module 4 in each of the unit blocks E1 to E3 due to the fluctuation of factory power and the influence of the heating of the apparatus provided outside the coating and developing apparatus 1 may be considered.

The coating and developing apparatus 1 is configured to cope with such a problem. In the coating and developing apparatus 1, the temperature of the coolant supplied from the chiller 55 (represented by the solid line arrow in FIG. 6) is controlled based on a detection signal output from the temperature sensor 26 provided in the unit block E3 as described above to the controller 50. In FIG. 6, this detection signal is indicated by a one-dot chain line, and a control signal for temperature control output from the controller 50 to the chiller 55 is indicated by a two-dot chain line. That is, in the coating and developing apparatus 1, the temperatures of the temperature adjustment modules SCPL1 to SCPL3 (=the temperatures of the wafers W in the temperature adjustment modules SCPL1 to SCPL3) are feedback controlled based on the temperature detected by the temperature sensor 26. The chiller 55 and the controller 50 are configured as a temperature changing mechanism that changes the temperatures of the wafers W in the temperature adjustment modules SCPL1 to SCPL3.

Specifically, a control is performed such that the higher the temperature detected by the temperature sensor 26, the lower the temperatures of the temperature adjustment modules SCPL1 to SCPL3, and the lower the temperature detected by the temperature sensor 26, the higher the temperatures of the temperature adjustment modules SCPL1 to SCPL3. In order to perform such a temperature control, the storage unit of the controller 50 stores data on the correspondence relationship between the temperature detected by the temperature sensor 26 and the temperature adjustment modules SCPL, and a control is performed based on this correspondence relationship. Since a plurality of temperature sensors 26 are provided in the unit block E3 in the above example, for example, an average value of temperatures detected by these temperature sensors 26 is handled as a detected temperature.

Figure 8:
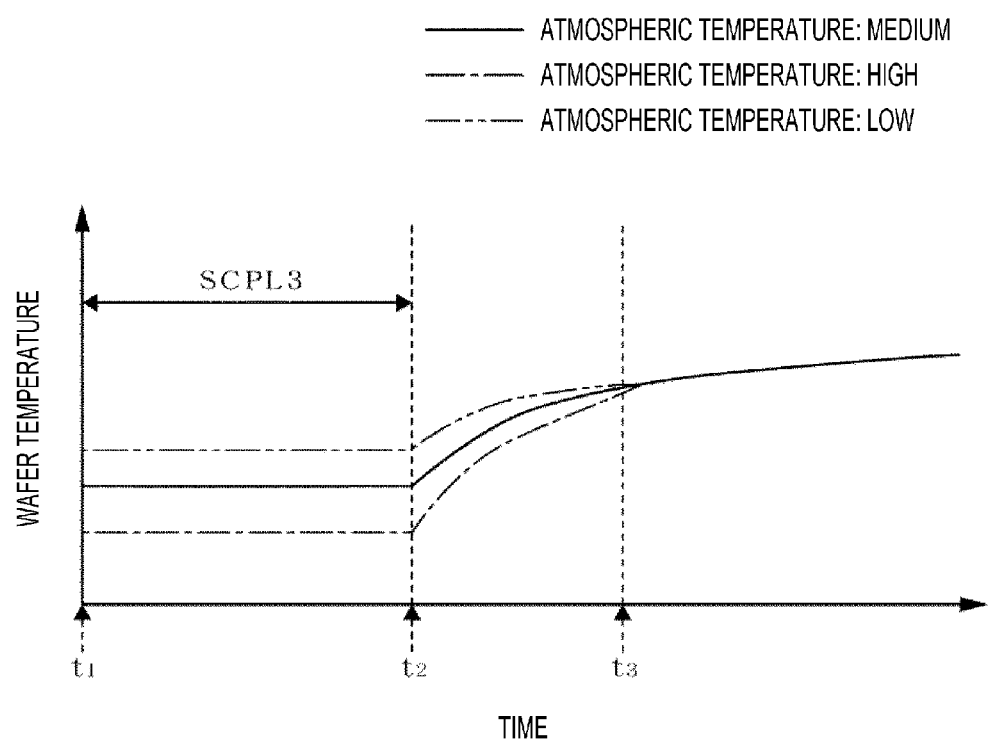
FIG. 8 is a graph representing time-dependent changes in the temperatures of wafers transported in the unit block.

The graph of FIG. 8 represents the transitions of the temperatures of wafers W when the temperature of the temperature adjustment module SCPL3 is controlled based on a detected temperature in the same manner as the graph of FIG. 7. Accordingly, the solid line, the one-dot chain line, and the two-dot chain line in the graph indicate the temperature transitions of wafers W when the atmosphere of the unit block E3 has the set temperature, when the atmosphere of the unit block E3 has a temperature higher than the set temperature, and when the atmosphere of the unit block E3 has a temperature lower than the set temperature, respectively. As described above, since the temperature adjustment module SCPL3 is adjusted to different temperatures depending on the atmospheric temperature of the unit block E3, the temperatures of respective wafers W from time t1 to time t2 differ from each other. Therefore, at time t2 when the wafers are unloaded from the temperature adjustment module SCPL3, the temperatures of the wafers W decreases in the order of the case in which the atmospheric temperature is lower than the set temperature, the case in which the atmospheric temperature is the set temperature, and case in which the atmospheric temperature is higher than the set temperature.

In the case in which the atmospheric temperature is higher than the set temperature, the amount of increase in the temperature of the wafer W from the time t2 to the time t3 (when loaded into the resist film forming module 3) is large compared with that in the case in which the atmospheric temperature is the set temperature. Meanwhile, in the case in which the atmospheric temperature is lower than the set temperature, the amount of increase in the temperature of the wafer W from time t2 to time t3 is smaller than that in the case in which the atmospheric temperature is the set temperature. Accordingly, the variation in the temperature of each wafer W at time t3 is suppressed, and as a result, it is possible to suppress the variation in the film thickness of the resist film formed on each wafer W. Even if the above-described temperature fluctuation of the clean room is a short-term fluctuation that fluctuates several ° C. in a day or a long-term fluctuation that fluctuates several ° C. in a few months, such a control is capable of suppressing the temperature variation of each wafer W at time t3.

As described above, the unit blocks E1 to E3 perform the same processing on the wafers W with the same configuration. For that reason, in this example, it is assumed that the atmospheric temperatures of the unit blocks E1 to E3 are the same or substantially the same, and only the unit block E3 among the unit blocks E1 to E3 is provided with the temperature sensors 26, and the temperature adjustment modules SCPL1 to SCPL3 are controlled to have the same temperature.

Figure 10:
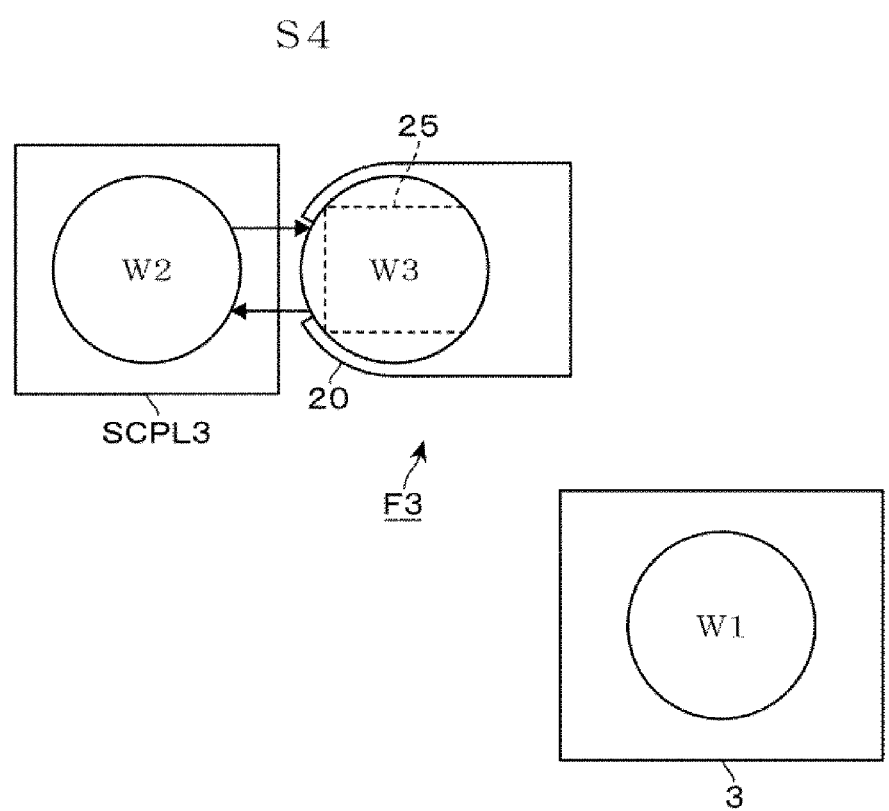
FIG. 10 is an explanatory view illustrating a transport state of a wafer.
Figure 11:
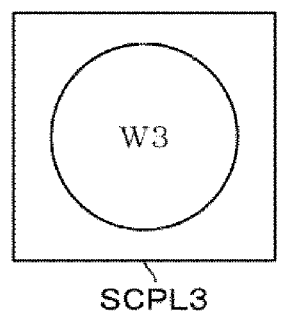
FIG. 11 is an explanatory view illustrating a transport state of a wafer.
Figure 11:
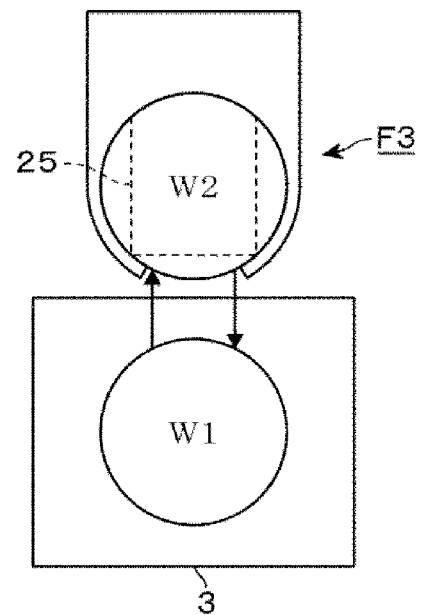

Furthermore, in the coating and developing apparatus 1, the operations of the transport mechanisms F1 to F3 are controlled such that the time for transporting wafers from the temperature adjustment modules SCPL1 to SCPL3 to the resist film forming module 3 are aligned between the wafers. By performing the transport control, the temperature variation at the time of loading the wafers W into the resist film forming module 3 is more reliably suppressed. The transport control is similarly performed for the transport mechanisms F1 to F3, but the transport control by the transport mechanism F3 will be described as a representative with reference to FIG. 9. In addition, FIGS. 10 and 11 illustrating the transport states of wafers W are also referred to as appropriate.

Figure 9:
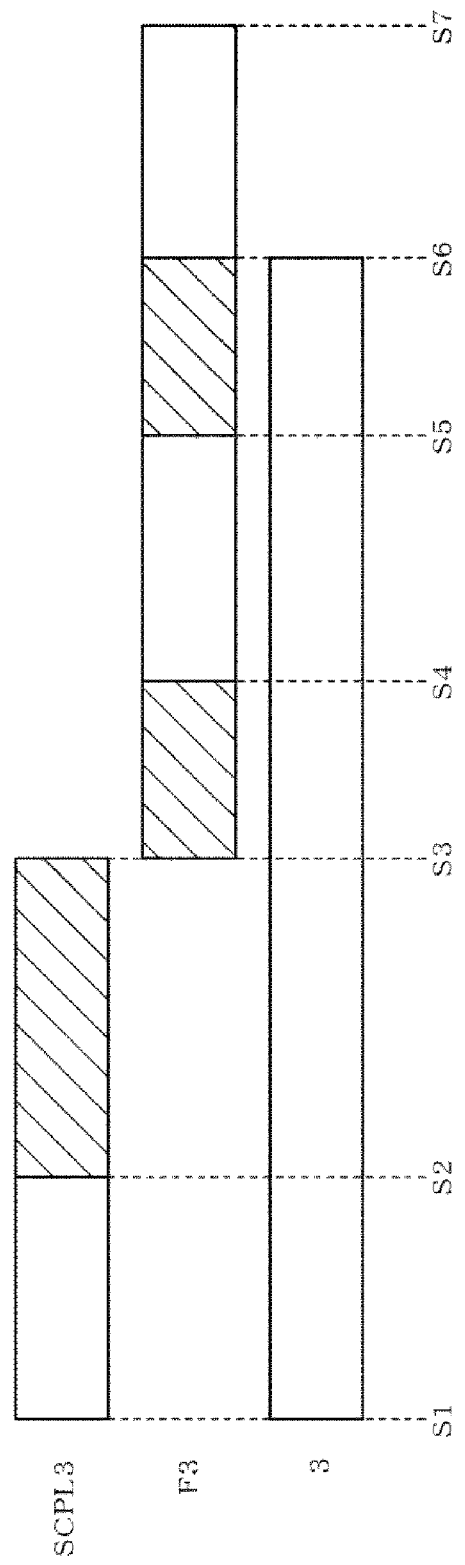
FIG. 9 is a chart illustrating a transport control of a wafer.

In the timing chart of FIG. 9, the states of the temperature adjustment module SCPL3, the transport mechanism F3, and the resist film forming module 3 are respectively represented. More specifically, for the temperature adjustment module SCPL3, the period in which a wafer W is placed therein is indicated by a horizontally long bar, for the transport mechanism F3, the period in which the operation is performed (the period not in the standby state) is indicated by a horizontally long bar, and for the resist film forming module 3, the period in which a processing is performed is indicated by a horizontally long bar. In this transport control, the wafer W is placed on the temperature adjustment module SCPL3 even after the temperature adjustment is completed. In the bar of the temperature adjustment module SCPL3, a portion corresponding to the period in which the temperature adjustment is completed and the wafer W is placed is hatched to be distinguished from a portion corresponding to the period in which the temperature adjustment is not completed. As for the bar of the transport mechanism F3, a portion corresponding to the period in which the base 25 constituting the transport mechanism F3 moves between modules is hatched to be distinguished from a portion corresponding to the period in which the movement of the base 25 is completed and the replacement of wafers W is performed for the above-mentioned modules. In describing the transport control, three wafers W transported from the temperature adjustment module SCPL3 to one of the two resist film forming modules 3 of the unit block E3 will be described as W1, W2, and W3 in order from the first transported wafer.

At time s1 in the chart, the wafer W1 (first substrate) is processed in the resist film forming module 3, and the temperature of the wafer W2 (subsequent substrate) is adjusted in the temperature adjustment module SCPL3. As described with reference to FIG. 8, the temperature of the wafer W2 is adjusted to a temperature corresponding to the atmospheric temperature of the unit block F3 (time s2), and is subsequently put in a standby state in the temperature adjustment module SCPL3. Meanwhile, the transport mechanism F3 receives the wafer W3 from the delivery module TRS3 and is in a standby state at a predetermined position in the transport path 21 of the unit block E3.

Subsequently, when a predetermined time elapses after the wafer W1 is transported to the resist film forming module 3, the base 25 of the transport mechanism F3 starts to move to the delivery position for the temperature adjustment module SCPL3 (time s3). At this time, since the processing of the wafer W1 is not completed in the resist film forming module 3, it is impossible to unload the wafer W1. When the movement of the base 25 to the delivery position described above is completed (time s4, FIG. 10), through the cooperation of the raising/lowering operation of the base 25 and the advancing/retreating operation of the substrate support 20, the transport mechanism F3 receives the wafer W2 from the temperature adjustment module SCPL3, and performs replacement for disposing the wafer W3 on the temperature adjustment module SCPL3.

When this replacement is completed, the base 25 starts to move to the delivery position for the resist film forming module 3 (time s5). The base 25 reaches this delivery position and the processing of the wafer W1 in the resist film forming module 3 is completed, so that it becomes possible to unload the wafer W1. As described above, simultaneously when it becomes possible to unload the wafer W1, the replacement of the wafers W1 and W2 by the transport mechanism F3 is started (time s6, FIG. 11), the transport mechanism F3 receives the wafer W1, and the wafer W2 is unloaded to the resist film forming module 3 (time s7). Then, the processing of the wafer W2 is started in the resist film forming module 3. The wafers W other than the wafer W2 are also transported from the temperature adjustment module SCPL3 to the resist film forming module 3 in the same manner as the wafer W2.

Thus, in the transport control described above, the timing at which a wafer W is unloaded from the temperature adjustment module SCPL3 is determined based on the elapsed time of the processing of the wafer W in the resist film forming module 2. Then, simultaneously when the processing of the wafer W is completed in the resist film forming module 3, the transport of the wafer W to the resist film forming module 2 by the transport mechanism F3 is performed. Accordingly, with respect to the transport mechanism F3 that holds the wafer W, of which the temperature has been adjusted by the temperature adjustment module SCPL3, it is unnecessary to put the transport mechanism F3 in the standby state until the wafer W is loaded into the resist film forming module 3 due to the fact that the resist film forming module 3 is processing another wafer W. That is, in the chart of FIG. 9, the time from time s4 when a wafer W is delivered to the temperature adjustment module SCPL3 to time s6 when the wafer W is delivered to the resist film forming module 3 is aligned between respective wafers W. Accordingly, as described above, the time in which a wafer W is transported from the temperature adjustment module SCPL3 to the resist film forming module 3 is aligned between the wafers W.

The timing at which the wafer W2 is unloaded from the temperature adjustment module SCPL3 is not limited to the example described with reference to FIG. 9. For example, after the processing of the wafer W1 is completed by the resist film forming module, the wafer W2 may be unloaded from the temperature adjustment module SCPL3. Even in such a case, in transporting the wafer W2 is to the resist film forming module 3, it is not necessary to wait due to the fact that the resist film forming module 3 is processing the wafer W1. Accordingly, it is possible to align the transport time from the temperature adjustment module SCPL3 to the resist film forming module 3 between the wafers W. However, in order to obtain a higher throughput, as described with reference to FIG. 9, it is preferable to perform the reception of a wafer W from the temperature adjustment module SCPL3 and the transportation of the wafer W to the resist film forming module 3 in parallel with the processing of the wafer W1 in the resist film forming module 3. In addition, the timing at which the transport mechanism F3 accesses the temperature adjustment module SCPL3 may be slightly delayed from the example of FIG. 9 such that the transport mechanism F3 accesses the resist film forming module 3 to load the wafer W2 slightly after the completion of the processing of the wafer W1.

Next, the transport paths of wafers W in the entire coating and developing apparatus 1 will be described. Wafers W are transported to the delivery module TRS0 of the tower T1 in the processing block D3 from a carrier C by the transport mechanism 13. The wafers W are allocated from the transport module TRS0 to the transport modules TRS1 to TRS3 by the transport mechanism 13. Then, the wafers W are transported from the transport modules TRS1 to TRS3 to the transport modules SCPL1 to SCPL3 by the transport mechanisms F1 to F3, and the temperatures thereof are adjusted. Thereafter, as described with reference to FIG. 6, the wafers W are transported to the resist film forming module 3 by the transport mechanisms F1 to F3 to form a resist film thereon, and further transported to the heating modules 4 of the unit blocks E1 to E3, respectively, to be subjected to a heating processing (PAB). The wafers W after the heating processing are transported to the delivery modules TRS11 to TRS13 of the tower T2 of the interface block D4. Thereafter, the wafers W of these transport modules TRS11 to TRS13 are transported by the transport mechanisms 14 and 16 to the exposure machine D5 via the module of the tower T3, and the resist films thereof are exposed along a predetermined pattern.

The exposed wafers W are transported by the transport mechanisms 15 and 16 to the transport modules TRS14 to TRS16 of the tower T2 via the modules of the tower T4. Then, the wafers W are transported from the delivery modules TRS14 to TRS16 to the heating modules 4 of the unit blocks E4 to E6 by the transport mechanisms F4 to F6, and are subjected to a heating processing (PEB). Thereafter, the wafers W are transported to a developing module, and subjected to a developing processing so that resist patterns are formed thereon. After the formation of the resist patterns, the wafers are transported to the transport modules TRS4 to TRS6 of the tower T1, and then returned to the carrier C via the transport mechanism 13.

According to the coating and developing apparatus 1, the temperatures of the temperature adjustment modules SCPL1 to SCPL3 provided corresponding to the unit blocks E1 to E3 are changed based on the atmospheric temperature of the unit block E3, as described above. Therefore, the temperature of each wafer W when it is loaded into the resist film forming module 3 is suppressed from fluctuating from a desired temperature. Accordingly, it is possible to form a resist film on each wafer W with a highly uniform film thickness.

In order to avoid complication of the explanation, relatively few types of processing modules provided in the unit blocks E1 to E6 are illustrated in the coating and developing apparatus 1. In addition to the processing modules, various processing modules may be provided. For example, a peripheral edge exposure module that exposes the peripheral edge of a wafer W after formation of the resist film and before loading into the exposure machine D5, or a rear surface cleaning module that cleans the rear surface of a wafer by supplying a cleaning liquid to the rear surface of the wafer W and rubbing the rear surface with a brush before loading into the exposure machine D5 may be provided. In addition, an antireflection film forming module that forms an antireflection film on a lower layer or upper layer of a resist film through spin coating of a chemical liquid may be provided, or an inspection module that acquires an image for determining an abnormality determination for the surface of a wafer W having a resist pattern formed thereon may be provided.

The peripheral edge exposure module may be provided in place of, for example, one of the heating modules 4 for PAB, which are provided in plural in each of the unit blocks E1 to E3, as described above. The rear surface cleaning module and the antireflection film forming module may be provided instead of, for example, one of the resist film forming modules 3, which are provided in plural in each of the unit blocks E1 to E3. The inspection module may be provided instead of, for example, one of the heating modules 4 for PEB, which are provided in plural in each of the unit blocks E4 to E6.

The temperature of a wafer W at the time of being loaded into each processing module other than the resist film forming module 3 described above may be controlled in the same manner as the temperature when the wafer W is loaded into the resist film forming module 3. That is, a wafer W is placed in a temperature adjustment module SCPL, of which the temperature is controlled based on the temperature detected by the temperature sensor 26, so as to adjust the temperature thereof, and the temperature-adjusted wafer W is directly transported to the processing module of the unit block corresponding to the temperature adjustment module SCPL. This enables the temperature of the wafer W at the time of being loaded into a processing module to be controlled.

Accordingly, the present disclosure is not limited to providing the temperature adjustment modules SCPL corresponding to the heights of the unit blocks E1 to E3, and the temperature adjustment modules SCPL corresponding to the heights of the unit blocks E4 to E6 may be provided. Then, the temperature of a wafer W at the time of being loaded into each processing module of the unit blocks E4 to E6 may be controlled. In the coating and developing apparatus 1 illustrated in FIG. 12, in addition to the above-described temperature adjustment modules SCPL1 to SCPL3, temperature adjustment modules respectively corresponding to the unit blocks E4 to E6 are provided in the tower T2, and these temperature adjustment modules are denoted as SCPL4 to SCPL6. Therefore, in this example, a temperature adjustment module is provided for each unit block E. As will be described later, one processing module of the unit blocks E4 to E6 corresponds to, for example, a developing module in which a wafer W is directly transported from the unit blocks E4 to E6 or a heating module 4 for PEB.

Figure 12:
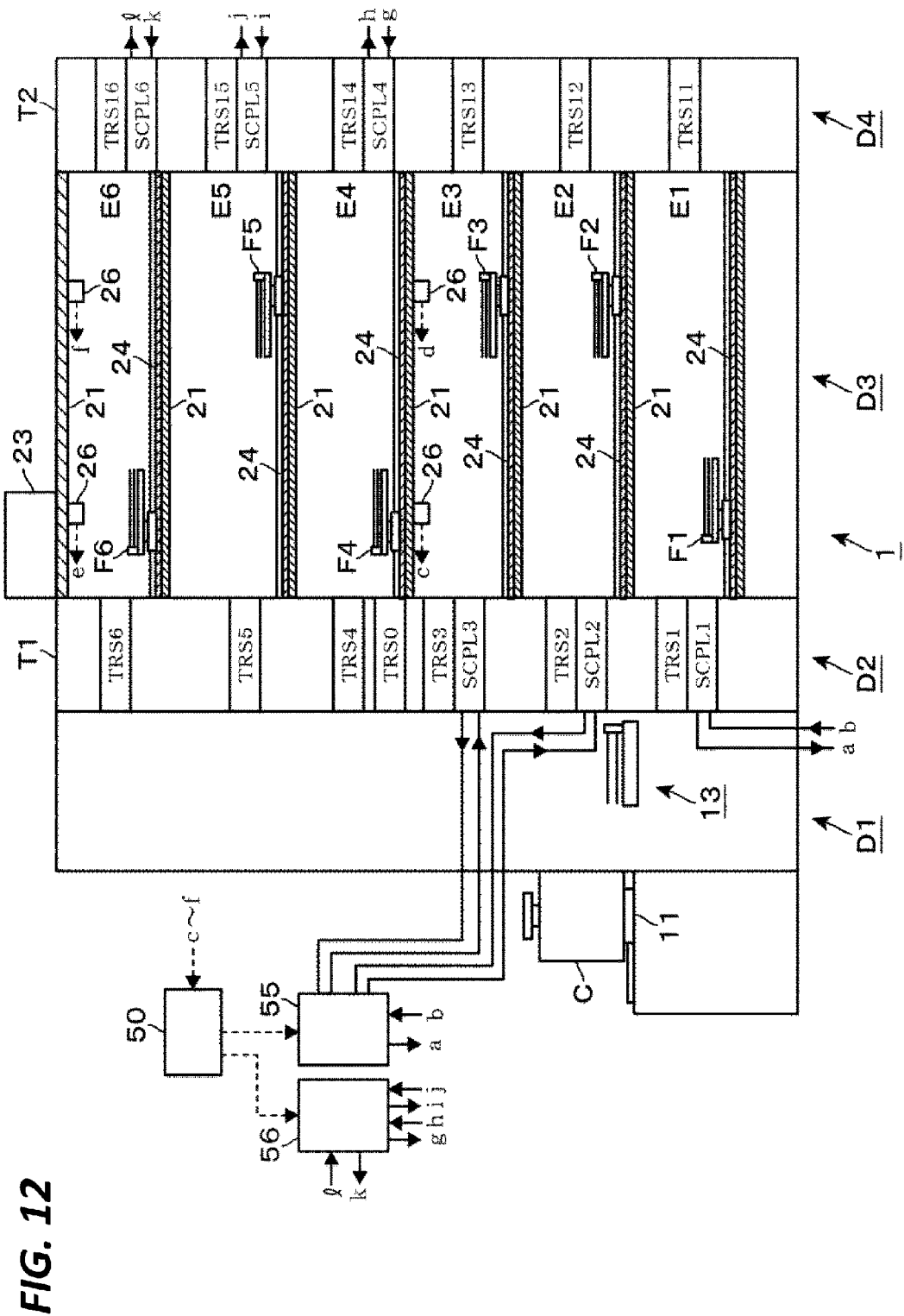
FIG. 12 is a vertical cross-sectional side view of another configuration example of a coating and developing apparatus.

In the coating and developing apparatus 1 of FIG. 12, a chiller 56 connected to the temperature adjustment modules SCPL4 to SCPL6 is provided separately from the chiller 55 connected to the temperature adjustment modules SCPL1 to SCPL3. In addition, temperature sensors 26 are provided in the unit block E6 as in the unit block E3, and the chiller 56 is controlled based on the temperature detected by the temperature sensors 26 of the unit block E6. Accordingly, the coating and developing apparatus 1 illustrated in FIG. 12 is configured such that the temperatures of the temperature adjustment modules SCPL1 to SCPL3 and the temperatures of the temperature adjustment modules SCPL4 to SCPL6 are controlled independently of each other.

Here, an effect obtained when a wafer W is directly transported from the temperature adjustment module to each processing module other than the resist film forming module 3 and the temperature thereof at the time of being loaded into the processing module is controlled will be described. First, the case in which wafers W are directly transported from the temperature adjustment modules SCPL1 to SCPL3 to the heating modules 4 for PAB of the unit blocks E1 to E3 will be described. In this case, the temperature of each wafer W loaded into a heating module 4 is made to be uniform between the wafers W, and each wafer W is similarly heated, and thus it is expected that it is possible to enhance the uniformity of the film thickness between the respective wafers W.

In addition, the case in which wafers W are directly transported from the temperature adjustment modules SCPL1 to SCPL3 to the unit blocks E1 to E3 will be described. During the exposure of the peripheral edge of a wafer W by the peripheral edge exposure module, when the temperature of the wafer W deviates from a set value, there is a possibility that exposure in the peripheral edge exposure module is not normally performed and thus a resist residue adheres to the wafer W during the development. However, it is expected that adhesion of the residue on each wafer W is suppressed by loading each wafer W into the peripheral edge exposure module in the state of being temperature-controlled.

In addition, when the wafers W are directly transported from the temperature adjustment modules SCPL1 to SCPL3 to the rear surface cleaning modules of the unit blocks E1 to E3, it is expected that the reduction in the action of the cleaning liquid supplied to each wafer W is suppressed. Accordingly, it can be expected that foreign matters on the rear surface of each wafer W are reliably removed and defects caused by the foreign matters are reduced. When the wafers W are directly transported from the temperature adjustment modules SCPL1 to SCPL3 to the antireflection film forming modules of the unit blocks E1 to E3, the uniformity of the film thickness between the wafers W is increased as in the case of forming the resist film.

In addition, when the wafers W are directly transported from the temperature adjustment modules SCPL4 to SCPL6 to the developing modules of the unit blocks E4 to E6, the reaction between the developer and the resist film is uniform between the wafers W. Accordingly, it is possible to increase the uniformity in the critical dimension (CD) of the resist patterns between the wafers W, and to reduce the occurrence of development defects. In addition, when the wafers W, of which the temperatures have been adjusted by the temperature adjustment modules SCPL4 to SCPL6, are directly transported to the heating modules 4 for the PEB of the unit blocks E4 to E6, the heating processing is performed with high uniformity between the wafers W, thereby making the reactions of the resist films by heating uniform. Therefore, it is possible to improve the uniformity in the CD of resist patterns between the wafers W.

Further, when the wafers W are directly transported from the temperature adjustment modules SCPL4 to SCPL6 to the inspection modules of the unit blocks E4 to E6, it is possible to make the temperature during imaging uniform between respective wafers W. As the temperature of the wafer W during imaging is made to be uniform, a change in the color of an image acquired by the inspection module due to the variation in temperature is suppressed. Accordingly, it is possible to improve the abnormality detection sensitivity for each wafer W. The processings of wafers W includes the inspection of wafers W as described above, and the inspection modules are included in the processing modules.

The processing modules to which wafers W are directly transported from the temperature adjustment module SCPL in one unit block may be of one type or plural types. That is, the example in which a wafer W is transported from the temperature adjustment module SCPL3 to the resist film forming module 3 in the unit block E3 has been described, but the wafer W may be transported from the temperature adjustment module SCPL3 to each of the resist film forming module 3 and the heating module 4 for PAB. In that case, the wafer W is transported from the temperature adjustment module SCPL3 to the resist film forming module 3 by the transport mechanism F3, and this wafer W is transported again to the temperature adjustment module SCPL3 by the transport mechanism F3. Thereafter, the wafer W may be transported from the temperature adjustment module SCPL3 to the heating module 4 for PAB by the transport mechanism F3. When the wafer W is transported as in this way, the temperature adjustment module SCPL3 for adjusting the temperature of a wafer W transported to the resist film forming module 3 and the temperature adjustment module SCPL3 for adjusting the temperature of a wafer W transported to the heating module 4 may be the same as each other or may be provided separately.

Although the temperature adjustment of wafers W transported to the unit block E has been described, for example, wafers W may be directly transported from the temperature adjustment modules SCPL1 to SCPL6 to the exposure machine D5, and the temperature at the time of being loaded into the exposure machine D5 may be made to be uniform between the wafers W. By making the temperatures uniform in this way, it is conceivable that the resist reaction due to exposure is uniform between the wafers W and the exposure accuracy increases. Accordingly, in repeatedly performing photolithography and etching on wafers W, it is conceivable that the accuracy in overlay, that is, the overlapping state of the exposure areas at the time of each exposure is improved.

In the unit blocks E1 to E6, for example, the temperatures of the atmospheres may be different from each other due to the influence of heat released from each processing module. As described above, since the unit blocks E1 to E3 and the unit blocks E4 to E6 are perform different processings on wafers W, and thus it is conceivable that the temperatures thereof are different from each other. Therefore, as in the coating and developing apparatus 1 of FIG. 12, the temperature sensors 26 are provided in each of the unit blocks E3 and E6, and the temperature adjustment modules SCPL1 to SCPL3 and the temperature adjustment modules SCPL4 to SCPL6 are independently controlled based on the temperatures respectively detected by the temperature sensors 26, respectively. This makes it possible to control each of the temperature of a wafer W at the time of being loaded into a predetermined processing module provided in the unit blocks E1 to E3, and the temperature of a wafer W at the time of being loaded into a predetermined processing module provided in the unit blocks E4 to E6, with high accuracy, and to more reliably suppress a variation in processing states between the wafers W.

However, in providing the temperature adjustment modules SCPL1 to SCPL6 in this way, the temperature control is not limited to performing a temperature control for each of the temperature modules SCPL corresponding to unit blocks which are different in processing type as described above. That is, the temperature adjustment modules SCPL1 to SCPL6 may be collectively temperature-controlled by the chiller 55 such that the temperature adjustment modules SCPL1 to SCPL6 have the same temperature. In that case, for example, an average value of the detected temperatures of the temperature sensors 26 of the unit blocks E3 and E6 may be calculated, and the temperatures of the temperature adjustment modules SCPL1 to SCPL6 may be controlled based on the average value. Even in such a case, it is possible to prevent the temperatures of the wafers W at the time of being loaded into the processing modules from greatly fluctuating from a set temperature due to the atmospheric temperatures, and to suppress a variation in the processing state between the wafers W.

Further, in the above example, the temperature sensors 26 may be provided in each of the unit blocks E1 to E6, and the temperatures of the temperature adjustment modules SCPL1 to SCPL6 may be controlled based on the temperatures detected by respective temperature sensors 26. Even in this case, respective temperatures of the temperature adjustment modules SCPL1 to SCPL6 may be controlled to be the same temperature by one chiller, or may be independently controlled by a plurality of chillers to be different temperatures.

Furthermore, when the chillers 55 and 56 are provided as described above to independently control the temperatures of the temperature adjustment modules SCPL1 to SCPL3 and the temperature adjustment modules SCPL4 to SCPL6, temperature sensors 26 are disposed in one of the unit blocks E1 to E6, for example, the unit block E3. Based on the temperatures detected by the temperature sensors 26, the temperatures of the temperature adjustment modules SCPL1 to SCPL3 are controlled. Then, based on the temperatures detected by the temperature sensors 26, the temperatures of the temperature adjustment modules SCPL4 to SCPL6 may be controlled so as to be shifted by a predetermined amount from, for example, the temperatures of the SCPL1 to SCPL3. For example, when the atmospheric temperatures of the unit blocks E4 to E6 (E1 to E3) also vary depending on the atmospheric temperatures of the unit blocks E1 to E3 (E4 to E6), it is effective to control the temperature of each temperature adjustment module SCPL as described above.

The positions where the temperature sensors 26 are provided may be positions where the atmospheric temperatures of the unit blocks are detectable and the transport of wafers W is not hindered. However, it is considered that the atmospheric temperature may vary depending on a layout of respective heating modules 4 even in the same unit block. Although the temperature varies as described above, it is considered that since wafers W are transported to the processing modules through the transport path 21, as described above, the temperatures of the wafers W are greatly influenced by the temperature of the transport path 21. Therefore, in order to more surely make the temperatures of the wafers W at the time of being loaded into a processing module uniform, it is considered that a temperature sensor 26 may be provided in the transport path 21 as in the each of the above-described examples. However, since each processing module is provided along the transport path 21 in a unit block E, the temperature sensor 26 may be provided in the vicinity of the transport path 21 in the processing module. As an example, the temperature sensor 26 may be provided in the vicinity of the transport port 42 in the housing 41 of a heating module 4. In addition, the temperature sensor 26 may be provided, for example, in a processing module in which the temperature of a wafer W at the time of being loaded is to be controlled.

When a wafer W is directly transported from the above-mentioned temperature adjustment module SCPL3 to each of a resist film forming module 4 and a heating module 4 for PAB and the temperature thereof at the time of being loaded is adjusted, the wafer W passes through the transport path 21 during transport to any processing module. That is, it is advantageous to dispose the temperature sensor 26 in the transport path 21 common to a plurality of types of processing modules because it is expected that it is possible to control the temperature of a wafer W at the time of being loaded into each of these processing modules with high accuracy.

The present disclosure is not limited to providing a temperature adjustment module SCPL at the above-described position since it is sufficient if the transport mechanism F of a unit block E is capable of transporting a wafer W from the temperature adjustment module SCPL to the processing module in which the temperature of the wafer W at the time of being loaded is to be controlled. For example, the temperature adjustment module SCPL may be provided in the unit block E in place of one of the heating modules 4. In addition, the temperature adjustment modules SCPL1 to SCPL3 may be provided in the tower T2, and the temperature adjustment modules SCPL4 to SCPL6 may be provided in the tower T1.

The unit blocks are not limited to the configuration in which three identical unit blocks are provided as described above. For example, a configuration in which two identical unit blocks are provided may be used. In addition, an apparatus configuration may also be used in which the temperatures adjustment modules SCPL1 to SCPL6 are controlled based on the temperatures detected by the temperature sensors 26 as described above, and the temperature and humidity of the gas supplied to each of the unit blocks E1 to E6 as described in an evaluation test (to be described later).

In addition, the substrate processing apparatus of the present disclosure is not limited to the coating and developing apparatus 1, and the technique of the present disclosure is also applicable to a substrate processing apparatus other than the coating and developing apparatus, such as, for example, a cleaning apparatus that supplies a cleaning liquid to a wafer W for cleaning. In addition, the technique of the present disclosure may be applied to a coating apparatus in which the interface block D3 in the coating and developing apparatus 1 is not provided, a developing processing is not performed, and a coating film is formed in each unit block E. Furthermore, the substrate processing apparatus may have a configuration in which a processing block provided with a processing module is not divided into unit blocks, that is, not vertically divided. The processings described above for the processing modules are only an example, and may be provided with, for example, a processing module for coating a chemical liquid for forming, for example, an insulating film or a processing module for coating an adhesive for bonding a wafer W may be provided. In addition, the temperature adjustment module SCPL is not limited to the configuration cooled by the chiller, and may be configured such that the temperature of the plate 53 constituting the temperature adjustment module SCPL is controlled by being provided with a Peltier element on the plate 53.

It shall be understood that the embodiments disclosed herein are illustrative and are not restrictive in all aspects. The above-described embodiments may be omitted, replaced, or modified in various forms without departing from the scope and spirit of the appended claims.

(Evaluation Test)

Hereinafter, evaluation tests related to the technique of the present disclosure will be described. In this evaluation test, wafers W are processed using coating and developing apparatuses having different configurations. One of the apparatuses is the coating and developing apparatus 1 described above, and the temperatures of the temperature adjustment modules SCPL1 to SCPL6 are controlled based on the temperatures detected by the temperature sensors 26. As another apparatus, an apparatus configured in the same manner as the coating and developing apparatus 1 except that the temperature control of the temperature adjustment modules SCPL based on the atmospheric temperatures of the unit blocks E is not performed is used, and the apparatus is referred to as an apparatus of a first comparative example. As still another apparatus, an apparatus in which the unit blocks E1 to E6, the vertical transport blocks D2, and the interface block D4 are each connected to a gas supply mechanism via a duct is used, and this apparatus is referred as an apparatus of a second comparative example. As in the apparatus of the first comparative example, the apparatus of the second comparative example is not provided with the temperature sensor 26, and the temperature control of the temperature adjustment modules SCPL based on the atmospheric temperatures of the unit blocks E is not performed. The gas supply mechanism in the apparatus of the second comparative example is configured to: take in the air of the clean room, adjust the temperature and humidity of the air so as to become a predetermined temperature and a predetermined humidity, respectively, and supply the air to each block through the duct.

Evaluation Test 1

In Evaluation Test 1, in each of the coating and developing apparatuses described above, in a specific processing module in which a wafer W is directly transported from a temperature adjustment module SCPL, the temperatures of a plurality of wafers W at the time of being loaded into a processing module were measured. Then, regarding the measured temperatures of the plurality of wafers W, the maximum value-minimum value was calculated as a variation. In addition, for the wafers W of which the temperatures were measured, after the resist patterns were formed, the maximum value-minimum value of CDs of the resist patterns was calculated as a CD variation.

Evaluation Test 1 performed using the coating and developing apparatus of the first comparative example in the environment in which the temperature of the clean room in which the coating and developing apparatus is installed is constant is referred to as Evaluation Test 1-1. Evaluation Test 1 performed using the coating and developing apparatus of the first comparative example in the environment in which the temperature of the clean room fluctuates by 2° C., that is, the environment in which the maximum value–minimum value of the temperature of the clean room temperature becomes 2° C. is referred to as Evaluation Test 1-2. Evaluation Test 1 performed using the coating and developing apparatus of the second comparative example in the environment in which the temperature of the clean room fluctuates by 2° C. is referred to as Evaluation Test 1-3. Evaluation Test 1 performed using the coating and developing apparatus 1 in the environment in which the temperature of the clean room fluctuates by 2° C. is referred to as Evaluation Test 1-4.

Figure 13:
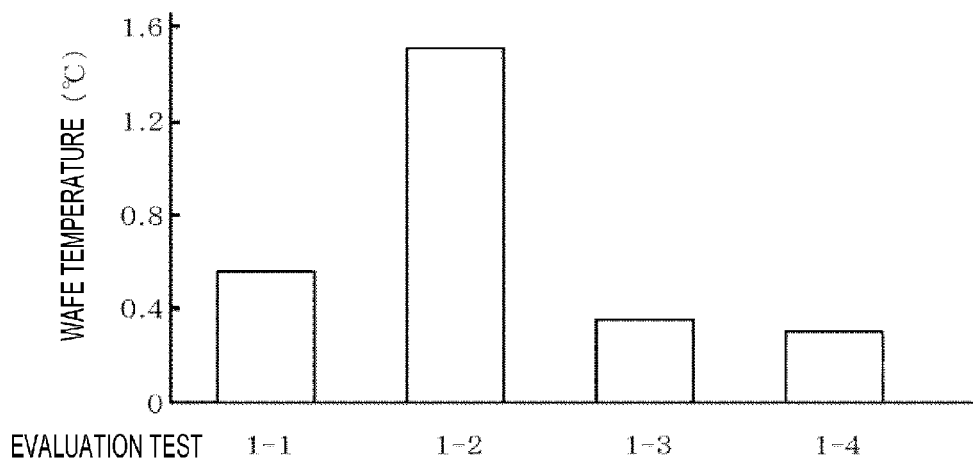
FIG. 13 is a graph representing a result of an evaluation test.
Figure 14:
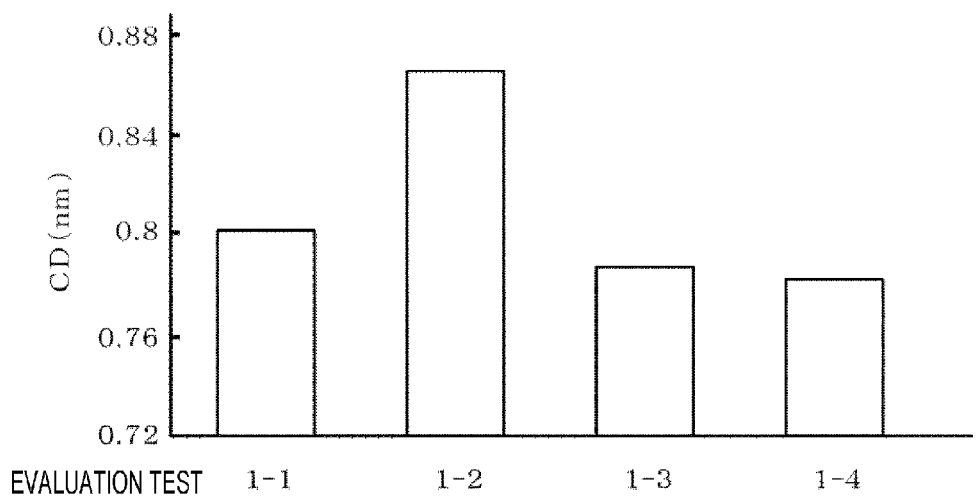
FIG. 14 is a graph representing a result of an evaluation test.

FIGS. 13 and 14 represent the results of Evaluation Tests 1-1 to 1-4. The bar graph of FIG. 13 represents the temperature variations (unit: ° C.) of wafers at the time of being loaded into the processing module, and the bar graph of FIG. 14 represents the CD variations (unit: nm). The temperature variations of wafers W in Evaluation Test 1-1, Evaluation Test 1-2, Evaluation Test 1-3, and Evaluation Test 1-4 were 0.56° C., 1.52° C., 0.35° C., and 0.29° C., respectively. The CD variations of Evaluation Test 1-1, Evaluation Test 1-2, Evaluation Test 1-3, and Evaluation Test 1-4 were 0.800 nm, 0.8666 nm, 0.786 nm, and 0.782 nm, respectively.

From the results of Evaluation Tests 1-1 and 1-2, it can be seen that, due to the influence of the temperature variations in the clean room, the temperature variations of wafers W at the time of being loaded into the processing module increase, and the CDs of the resist patterns also vary. Among the temperature variations of wafers W and the CD variations in Evaluation Tests 1-1 to 1-4, the variations in Evaluation Test 1-4 using the coating and developing apparatus 1 are the smallest. Accordingly, it was confirmed that by using the coating and developing apparatus 1 described above, it is possible to reduce the temperature variations of wafers W and the CD variations compared with the case in which the influence of the temperature fluctuation of the clean room is canceled and the temperature of the clean room does not fluctuate.

In addition, comparing the results of Evaluation Tests 1-3 and 1-4, the CD variations are the same, but the temperature variations of wafers W are greatly suppressed in Evaluation Test 1-4. As described above, the atmospheric temperature of the unit block may fluctuate due to various factors, but it is not possible to cope with such a fluctuation only by controlling the temperature and humidity of the air supplied to the unit block. It is considered that it is possible to more reliably cope with such fluctuations with the configuration of this example. Therefore, from Evaluation Test 1, the effects of the coating and developing apparatus 1 that suppress the variations in the processing states between wafers W as described above were confirmed, and it was confirmed that these effects are higher than those obtained by adjusting the temperature and humidity of the atmosphere supplied to the apparatus.

Evaluation Test 2

As Evaluation Test 2-1, in the environment in which the temperature of the clean room is constant, using the coating and developing apparatus of the first comparative example described in Evaluation Test 1, each of a resist film, an antireflection film called SiARC, and a resist pattern formed through negative development was formed on a plurality of wafers W. Then, the average film thickness of resist films in the wafers W and the average film thickness of antireflection films in the wafers W were calculated. In addition, the average value of CDs of resist patterns in the wafers W was calculated.

As Evaluation Test 2-2, a test similar to Evaluation test 2-1 was performed using the coating and developing apparatus of the first comparative example in an environment in which the temperature of the clean room fluctuates by 3° C. In addition, as Evaluation Test 2-3, a test similar to Evaluation Test 1-1 was performed using the coating and developing apparatus 1 in an environment in which the temperature of the clean room fluctuates by 3° C. In this coating and developing apparatus 1, a temperature control of each of wafers W is performed based on the atmospheric temperature obtained by the temperature adjustment module SCPL described above before being loaded into the resist film forming module and before being loaded into the antireflection film forming module.

Figure 15:
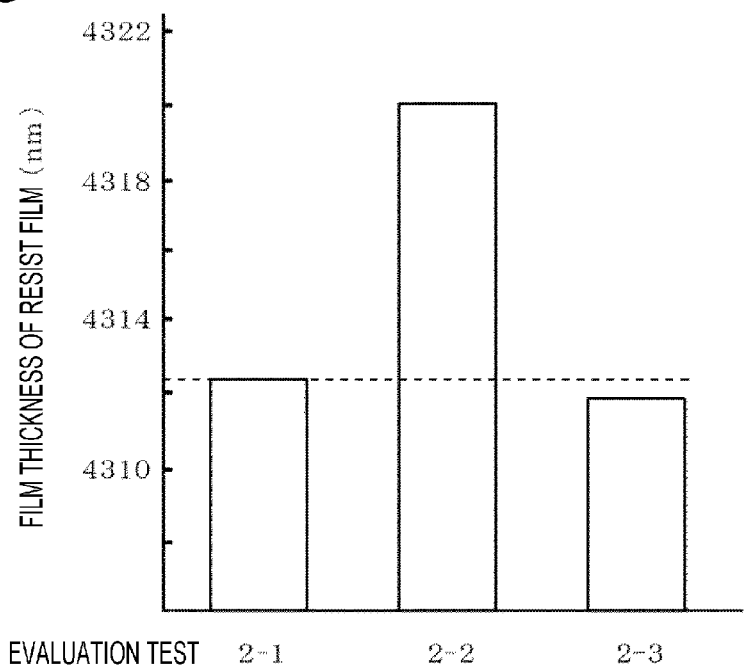
FIG. 15 is a graph representing a result of an evaluation test.
Figure 16:
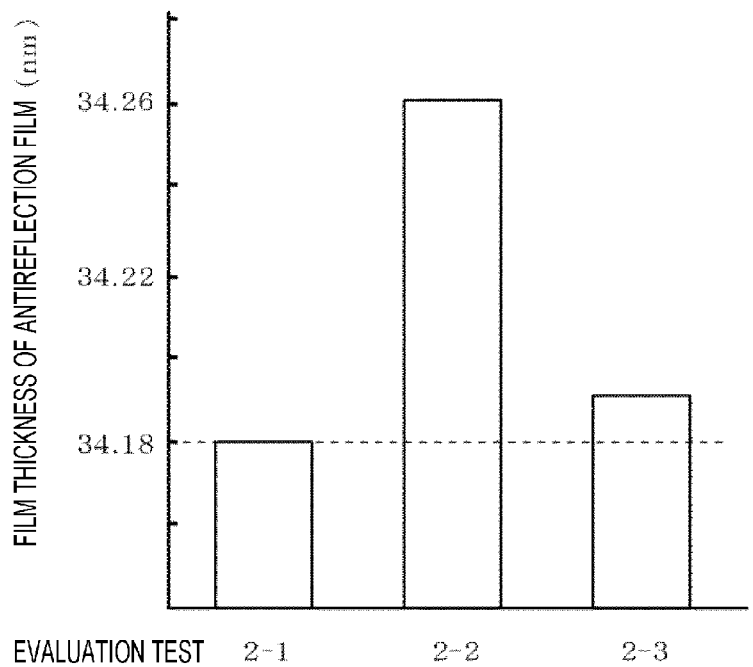
FIG. 16 is a graph representing a result of an evaluation test.
Figure 17:
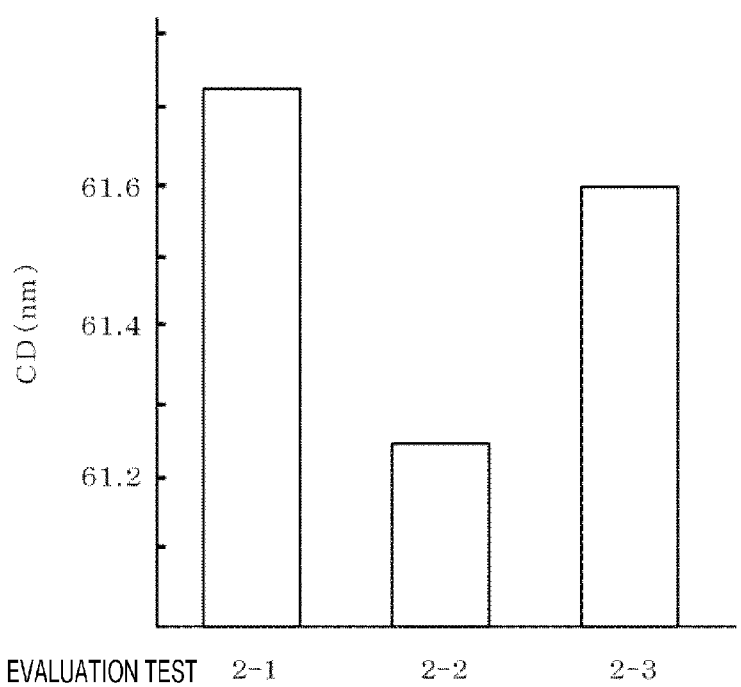
FIG. 17 is a graph representing a result of an evaluation test.

FIGS. 15, 16, and 17 are bar graphs representing the results concerning the average value of the thicknesses of resist films, the average value of the film thicknesses of antireflection films, and the average values of CDs, respectively. The average value of the thicknesses of the resist films is 431.25 nm in Evaluation Test 2-1, 4320.1 nm in Evaluation Test 2-2, and 4311.9 nm in Evaluation Test 2-3. The average value of the thicknesses of the antireflection films is 34.18 nm in Evaluation Test 2-1, 34.26 nm in Evaluation Test 2-2, and 34.19 nm in Evaluation Test 2-3. The average value of CDs is 61.73 nm in Evaluation Test 2-1, 61.25 nm in Evaluation Test 2-2, and 61.6 nm in Evaluation Test 2-3.

Thus, for each of the average value of the film thicknesses of the resist films, the average value of the film thicknesses of the antireflection films, and the average value of CDs, the difference between the result of Evaluation Test 2-1 and the result of Evaluation Test 2-2 is relatively large, but the difference between the result of Evaluation Test 2-1 and the result of Evaluation Test 2-3 is relatively small. Therefore, from the results of Evaluation Test 2, it was confirmed that by using the coating and developing apparatus 1, the film thickness variation and the CD variation of each film due to the temperature variation in the clean room are suppressed. Accordingly, from Evaluation Test 2, the effects of the coating and developing apparatus 1 were confirmed.

The present disclosure provides a technique capable of performing a processing with high uniformity between a plurality of substrates in processing the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating and developing apparatus comprising:
   a carrier block including a transport container that stores a substrate;
   a processing block including a plurality of substrate transport paths vertically stacked and partitioned from each other;
   a transport block positioned between the carrier block and the processing block and configured to transport the substrate between the transport container and the processing block;
   at least one processing module provided alongside each of the plurality of substrate transport paths of the processing block, configured to perform a processing on the substrate, and including a resist film forming module configured to form a resist film on the substrate and a developing module configured to develop the resist film completed with an exposure process;
   a transport mechanism including a substrate support positioned in each of the plurality of substrate transport paths and configured to transport the substrate between the transport block and the processing module;
   a temperature adjustment module positioned within the transport block and including a plate where the substrate is disposed, the temperature adjustment module being configured to adjust a temperature of the substrate within the temperature adjustment module before being transported to at least one processing module among plurality of the processing modules in the processing block to and unloading the substrate, of which the temperature has been adjusted, by the transport mechanism;
   a temperature sensor configured to detect an atmospheric temperature of at least one substrate transport path among the plurality of substrate transport paths; and
   a temperature controller configured to change the temperature of the substrate in the temperature adjustment module based on the atmospheric temperature detected by the temperature sensor.

2. The coating and developing apparatus according to claim 1, wherein the plurality of substrate transport paths include a first substrate transport path and a second substrate transport path,
   the at least one processing module is provided along each of the first substrate transport path and the second substrate transport path, and
   the temperature adjustment module includes a first temperature adjustment module configured to adjust the temperature of the substrate unloaded to the first substrate transport path, and a second temperature adjustment module configured to adjust the temperature of the substrate unloaded to the second substrate transport path.

3. The coating and developing apparatus according to claim 2, wherein one processing module in the first substrate transport path and one processing module in the second substrate transport path perform a same type of processings on the substrate.

4. The coating and developing apparatus according to claim 1, wherein the at least one processing module and the temperature adjustment module are provided for each of the plurality of substrate transport paths.

5. The coating and developing apparatus according to claim 1, wherein the temperature sensor is installed in a substrate transport path provided with the at least one processing module among the plurality of substrate transport paths.

6. The coating and developing apparatus according to claim 1, wherein the at least one processing module is a processing module configured to form a film by supplying a chemical liquid to the substrate.

7. The coating and developing apparatus according to claim 6, wherein the chemical liquid is a resist, and the processing module forms a resist film on the substrate.

8. The coating and developing apparatus according to claim 1, wherein the transport block includes a front block provided on an a front side of each of the substrate transport paths and configured to dispose therein the transport container, and a rear block provided on a rear side of each of the substrate transport paths and connected to an exposure machine that exposes the resist film, and the temperature adjustment module is provided at a height corresponding to the substrate transport area provided with the at least one processing module in at least one of the front block and the rear block.

9. The coating and developing apparatus according to claim 8, wherein the substrate transport path extends in a front-rear direction from the front block toward the rear block, and the plurality of processing modules including the at least one processing module are provided to face each other in a left-right direction with respect to the transport path.

10. The coating and developing apparatus according to claim 9, wherein the temperature sensor is installed in the transport path.

11. The coating and developing apparatus according to claim 1, wherein, in sequentially transporting a leading substrate and a subsequent substrate to the at least one processing module, a timing at which the transport mechanism supporting the subsequent substrate reaches a position where the substrate is delivered to the at least one processing module is coincident with or later than a timing at which the leading substrate is capable of being unloaded in the at least one processing module.

12. The coating and developing apparatus according to claim 11, wherein, in sequentially transporting the leading substrate and the subsequent substrate to the at least one processing module, an operation of the transport mechanism is controlled such that, prior to the timing at which the leading substrate is capable of being unloaded in the at least one processing module, the transport mechanism receives the subsequent substrate from the temperature adjustment module and unloads the subsequent substrate toward the at least one processing module.

13. A coating and developing method comprising:
unloading a substrate from a carrier block including a transport container that stores the substrate;
transporting the substrate from the transport container to a processing block including a substrate transport path by a transport block between the carrier block and the processing block;
transporting the substrate to at least one of a plurality of processing modules provided alongside the substrate transport path a transport mechanism to perform processings including formation of a resist film, and developing the resist film on which exposure has been completed;
adjusting a temperature of the substrate in a temperature adjustment module of the transport block before being transported to the at least one of the plurality of the processing modules in order to adjust the temperature of the substrate prior to being positioned in the at least one processing module;
transporting the substrate, of which the temperature has been adjusted in the temperature adjustment module, to the at least one processing module by the transport mechanism;
detecting an atmospheric temperature of the substrate transport path by a temperature sensor; and
changing the temperature of the substrate in the temperature adjustment module based on the atmospheric temperature detected by the temperature sensor in the substrate transport path.

* * * * *